United States Patent [19]

Sugita

[11] Patent Number: 5,644,590
[45] Date of Patent: Jul. 1, 1997

[54] SPREAD SPECTRUM COMMUNICATION APPARATUS AND SIGNAL INTENSITY DETECTION APPARATUS

[75] Inventor: Takehiro Sugita, Kanagawa, Japan

[73] Assignee: Sony Corporation, Tokyo, Japan

[21] Appl. No.: 391,064

[22] Filed: Feb. 21, 1995

[30] Foreign Application Priority Data

Feb. 23, 1994 [JP] Japan ................................. 6-025264

[51] Int. Cl.$^6$ .................................................. H04B 1/707
[52] U.S. Cl. ...................... 375/200; 375/208; 375/345; 375/367; 370/335; 455/226.2; 455/245.1
[58] Field of Search .................................. 375/200, 206, 375/205, 208, 345, 367; 455/226.1, 226.2, 226.3, 226.4, 245.1; 370/18

[56] References Cited

U.S. PATENT DOCUMENTS

| | | | |
|---|---|---|---|
| 5,347,284 | 9/1994 | Volpi et al. | 375/200 |
| 5,485,486 | 1/1996 | Gilhousen et al. | 375/205 |

FOREIGN PATENT DOCUMENTS

WO91/05415  4/1991  WIPO .................... 455/226.2

*Primary Examiner*—Stephen Chin
*Assistant Examiner*—Don Vo
*Attorney, Agent, or Firm*—Jay H. Maioli

[57] ABSTRACT

A spread spectrum communication apparatus for communication with a plurality of communication units includes a reception circuit, an automatic gain control circuit, a spread spectrum code detection circuit, and a synthesis circuit. The reception circuit receives signals of a frequency channel inclusive of a target communication unit. The automatic gain control circuit controls the signal intensity of the frequency channel received by the reception circuit to a constant level. The spread spectrum code detection circuit detects the signal intensity of the spread spectrum code of the target communication unit from an output signal of the automatic gain control circuit. The synthesis circuit combines the signal intensity which is based on a gain control signal of the automatic gain control means with a signal intensity as detected by the spread spectrum code detection circuit to find a reception intensity.

6 Claims, 7 Drawing Sheets

SPREAD SPECTRUM COMMUNICATION APPARATUS AND SIGNAL INTENSITY DETECTION APPARATUS

BACKGROUND

1. Field of the Invention

This invention relates to a spread spectrum communication apparatus and a signal intensity detection apparatus. More particularly, it relates to a spread spectrum communication apparatus and a signal intensity detection apparatus designed to find the signal intensity at a base station.

2. Background of the Invention

In a mobile communication system, such as a so-called cellular system, it is crucial for a mobile terminal to measure the signal power intensity at the base station since such measured signal power intensity serves as a measure of stability of a call to be provided to the user. In a currently serviced analog cellular system, the signal intensity of the frequency channel presently received is measured and displayed in several stages.

A mobile communication system employing a code division multiple access (CDMA) system is a system characterized by the fact that the same frequency channel is shared by a plurality of base stations, and by the fact that, even for a sole base station, a plurality of code channels are multiplexed on the same frequency channel.

Figure 1:
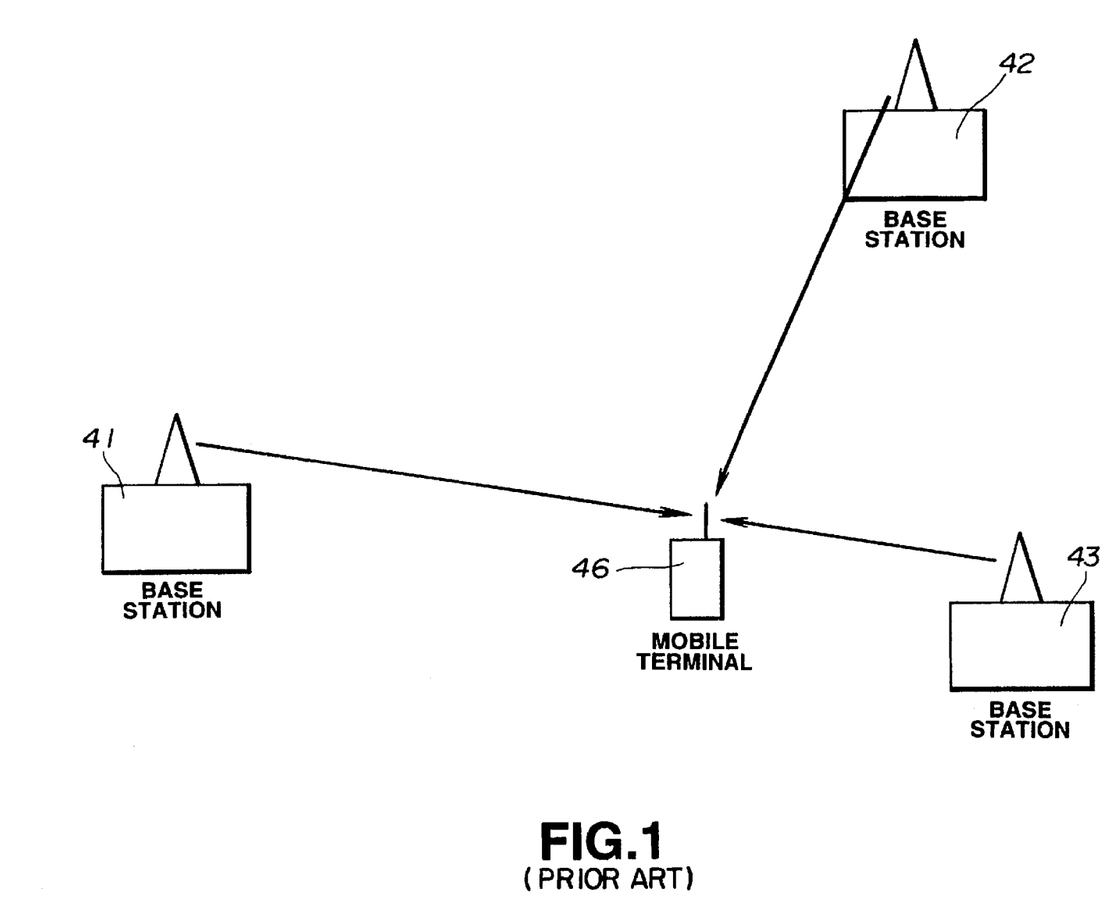
FIG. 1 is a schematic view showing an arrangement of a typical cellular system.

FIG. 1 schematically shows the usual cellular communication system. In FIG. 1, there is shown an example in which communication is had between a sole mobile terminal 46 and a plurality of, herein three, base stations 41, 42 and 43.

In an analog modulation cellular system or a time division multiple access (TDMA) cellular system, different frequency channels are employed for transmission by respective base stations. In the CDMA cellular system, each base station shares the same frequency channel with the aid of the spread spectrum technique. The spread spectrum communication system exploits pseudo random number series, known as a spread spectrum code or spread code, or a so-called PN code. However, by employing different random number series or temporally shifted random number series in different base stations, signals of a plurality of base stations may be multiplexed on the same frequency. It is necessary for a mobile terminal to be moved during a call from a service area of a base station to which it is initially connected to be connected to a different base station. This is termed hand-off. A hard hand-off, in which a mobile terminal has its network connected to one base station, is used with the analog modulation cellular system or a TDMA cellular system, while a soft hand-off, in which the mobile station has its network connected to a plurality of base stations simultaneously, is used with the CDMA cellular system.

In addition, with the CDMA cellular system, a plurality of channels on which signal transmission is made from respective base stations are multiplexed using the same frequency channel. With a forward link, that is, a link from a base station towards a mobile station, of the CDMA cellular system, there are provided four different code channels, namely, a pilot channel, a sync channel, a paging channel and a traffic channel. The pilot channel is a channel over which data is not transmitted and the above-mentioned PN code is repeatedly transmitted. The pilot channel is employed for synchronization capturing and maintenance by the mobile terminal and for clock generation. The sync channel is employed for matching the time information and long-term PN code between the base station and the mobile station. The paging channel is employed for transmission of the information required for hand-off, the information for calling the terminal on termination and the allocation information of the traffic channel. The traffic channel is employed for transmitting the speech information during a call.

Figure 2:
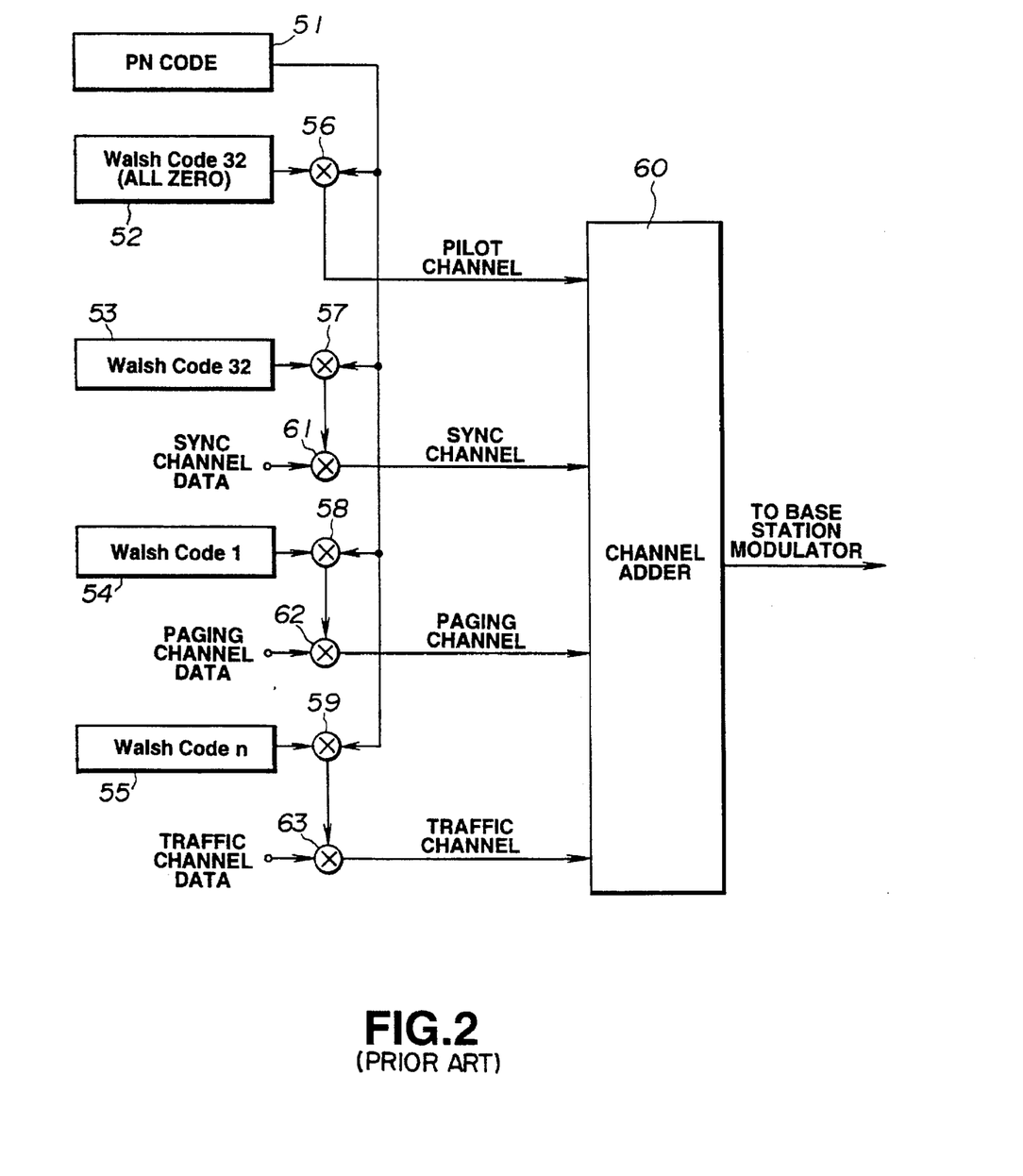
FIG. 2 shows a channel construction in the communication from the base station towards the mobile station in a spread spectrum mobile communication system.

FIG. 2 schematically shows the construction of a transmitting section of a base station.

With the CDMA cellular system, the above-mentioned respective channels are multiplexed by changing the spread codes to be multiplied by data and transmission is made using the same frequency. With the present system, the PN code is multiplied by a Walsh code to give a code used as a spread code and respective channels are generated by changing the Walsh code. With the pilot channel, the Walsh code is always zero such that the PN code is transmitted directly. Thus the detection of the PN code transmitted by the base station means checking for timing of the spread code of the pilot channel. It is possible for the mobile terminal to select the spread code generated by the PN code generator in order to demodulate data of the desired code channel. The pilot channel, however, is not a channel designed to take out data.

Referring to FIG. 2, the pseudo random numbers or the PN code from a PN code generator 51 are transmitted to multipliers 56, 57, 58 and 59, which are fed with the Walsh code from Walsh code generators 52, 53, 54 and 55, respectively. The Walsh code generator 52 transmits the Walsh code, which is perpetually zero (Walsh code 0) for the pilot channel, such that the PN code from the PN code generator 51 is directly routed via the multiplier 56 to a channel addition unit 60 as a pilot channel signal. The Walsh code generators 53, 54 routes pre-set Walsh codes, such as a Walsh code 32 and a Walsh code 1, to the multipliers 57, 58, respectively. Outputs of these multipliers 57, 58 are routed to multipliers 61, 62 for multiplication by sync channel data and paging channel data, respectively. The resulting multiplied outputs are routed to the channel addition unit 60. The Walsh code generator 55 routes the Walsh code other than the Walsh codes from the Walsh code generators 53, 54, that is, the Walsh code n where n is different from 0, 1 or 32, to a multiplier 59, an output of which is fed to a multiplexor 63 for multiplication by data from the traffic channel. The resulting multiplied data is routed to the channel addition unit 60. The channel addition unit sums the data from the respective channels and routes the sum data to a modulator of a base station.

Figure 3:
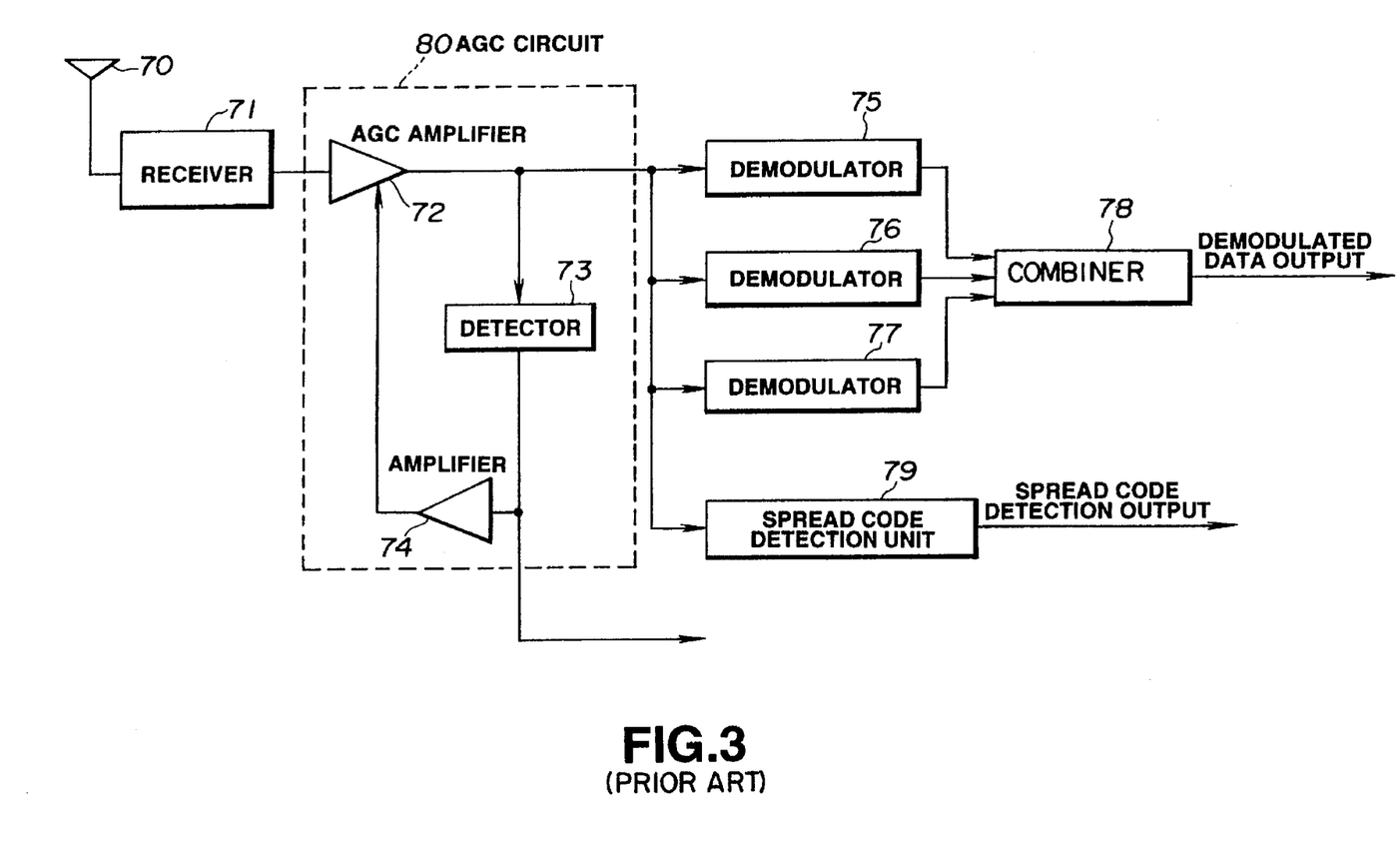
FIG. 3 is a schematic block circuit diagram showing an arrangement of a mobile terminal of a spread spectrum mobile communication system.

FIG. 3 schematically shows the construction of a receiver of a mobile terminal of the CDMA cellular system.

Referring to FIG. 3, signals received over an antenna 70 is frequency-converted by a receiver 71 before entering an AGC circuit 80. An output of the AGC circuit 80 is routed to a base station spread code detection unit 79 termed a searcher and to a plurality of, herein three, demodulators 75, 76 and 77. The spread code detection unit 79 measures the signal intensity and the time points of the spread code contained in the pilot channel transmitted by the base station. The demodulators 75 to 77 separately demodulate signals with different delays generated by different paths, namely multipasses, or signals transmitted from different base stations for a soft hand-off. The demodulation operation by the demodulator 75 to 77 is executed on the basis of an output of the spread code detection unit 79. Outputs of these demodulators 75 to 77 are routed to a combiner unit 78 which combines respective demodulated outputs to output a combined demodulated signal having a high S/N ratio. The AGC circuit 80 is made up of an AGC amplifier 72, a detector 73 and an amplifier 74 for amplifying an output of the detector 73 for generating a control signal for the AGC amplifier 72. For providing a constant power of the amplifier 72, a control signal is fed back to the amplifier 72 via the detector 73 and the amplifier 74.

As discussed above, it is desirable to detect the reception signal intensity of the received signal as a measure of the state of call stability. Thus it may be envisaged to utilize an output of the detector 73 in the AGC circuit 80 of FIG. 3 converted into, for example, electric power, as the information representing the reception intensity.

Figure 4:
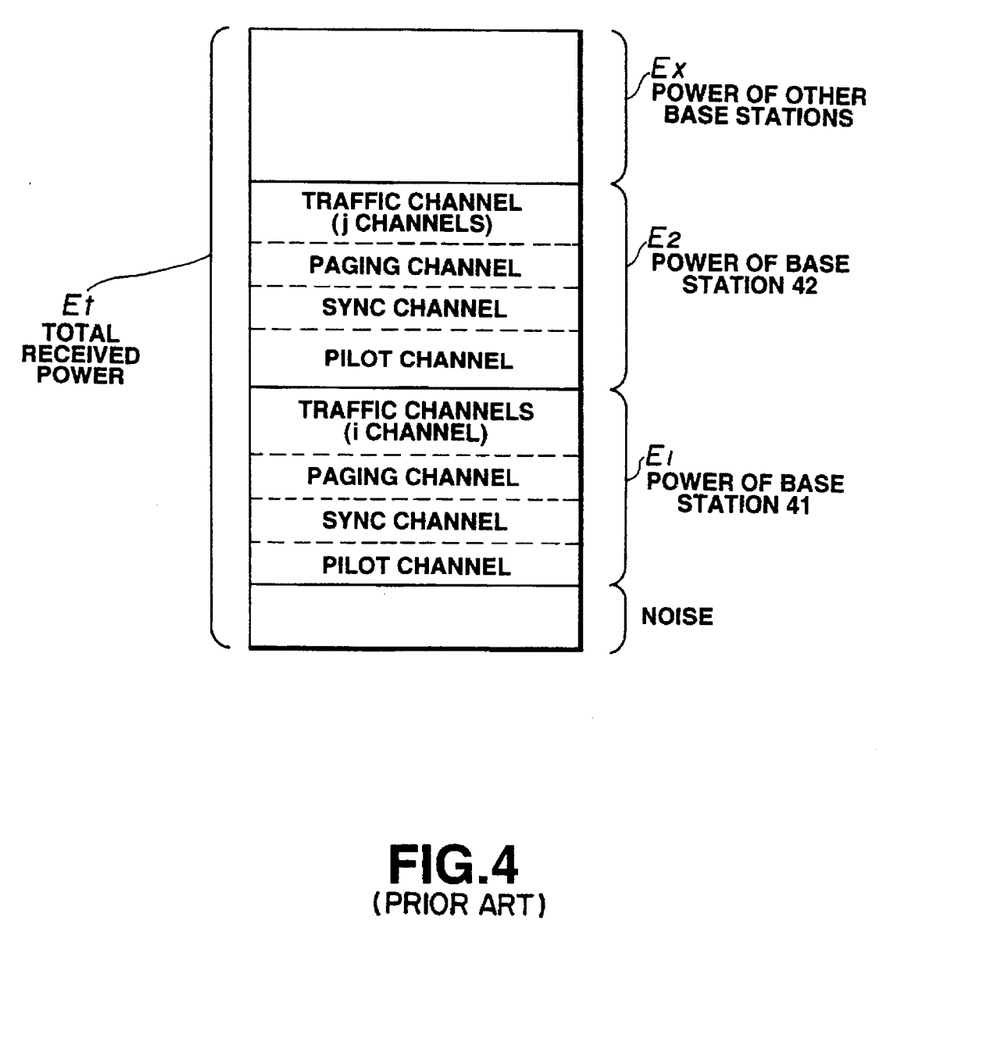
FIG. 4 is a diagrammatic view showing the contents of electric power received by a frequency channel at a mobile terminal.

FIG. 4 shows the contents of the received power for a frequency channel received by a mobile terminal. With the analog modulation cellular system or a TDMA cellular system, it is only the specified base station and moreover its specified channel, for example, a pilot channel of the base station 41 of FIG. 1, that the mobile terminal receives at the same frequency. Thus the signal intensity of the specified channel of the specified base station can be known by measuring the total received power. However, with the CDMA cellular system, the signals transmitted by a plurality of base stations are multiplexed on the same frequency.

That is, the powers $E_1$ of the base station 41, $E_2$ of the base station 42 and the power $E_x$ of other base stations are contained in the total received power $E_t$ on the same frequency channel, as shown in FIG. 4. In addition, the transmitted power of, for example, the base station 41, is made up of the powers of the pilot channel, sync channel, paging channel (comprising up to seven channels) and the traffic channel (i channels). The number of the traffic channels employed i is changed with the number of the terminals connected to the base stations. For measuring the signal intensity of a specified base station with the CDMA cellular system, it is necessary to measure the power of the pilot channel of the specified base station. However, since the ratio of the power of the pilot channel to the total received power is not constant, the intensity of the received signal cannot be measured sufficiently accurately with such a method of measuring the total received power.

The following method may also be employed for estimating the signal intensity from the base station.

Data transmitted from the base station is coded by convolutional coding. At a mobile terminal, the coded data is corrected for errors using Viterbi decoding. The signal intensity may be estimated by finding the error rate from the decoding process and by converting the error rate into the signal intensity. However, this method is in need of a considerable data volume in order to maintain estimation accuracy, moreover it has to demodulate and decode signals of the base station and hence is not suitable if the mobile terminal is in a stand-by state. For these reasons, more reliable means for estimation have been desired.

SUMMARY OF THE INVENTION

It is therefore an object of the present invention to provide a spread spectrum communication apparatus which resolves the above-mentioned problems.

It is another object of the present invention to provide a spread spectrum signal intensity detection apparatus which resolves the above-mentioned problems.

In one aspect, the present invention provides a spread spectrum communication apparatus for communication with a plurality of communication units including a reception circuit, an automatic gain control circuit, a spread spectrum code detection circuit, and a synthesis circuit. The reception circuit receives signals of a frequency channel inclusive of a target communication unit. The automatic gain control circuit controls the signal intensity of the frequency channel received by the reception circuit to a constant level. The spread spectrum code detection circuit detects the signal intensity of the spread spectrum code of the target communication unit from an output signal of the automatic gain control circuit. The synthesis circuit combines the signal intensity which is based on a gain control signal of the automatic gain control means with a signal intensity as detected by the spread spectrum code detection means to find a reception intensity.

In another aspect, the present invention provides a signal intensity detection apparatus including an automatic gain control circuit, a spread code detection circuit and a synthesis circuit. The automatic gain control circuit controls the intensity of an input signal to a constant level. The spread code detection circuit detects the signal intensity of the spread code of the target communication unit from an output signal of the automatic gain control circuit. The synthesis circuit combines the signal intensity which is based on a gain control signal of the automatic gain control means with a signal intensity as detected by the spread code detection means to find a reception intensity.

According to the present invention, the reception intensity or the power of the target communication unit (base station) may be found by finding the total reception intensity of the frequency channel being received from the gain control signal of the automatic gain control circuit and by measuring the signal intensity or power of the spread code of the target communication unit (base station).

DESCRIPTION OF THE INVENTION

Referring to the drawings, preferred embodiments of the present invention will be explained in detail. These embodiments are directed to a spread spectrum communication system as applied to the above-mentioned CDMA cellular system.

Figure 5:
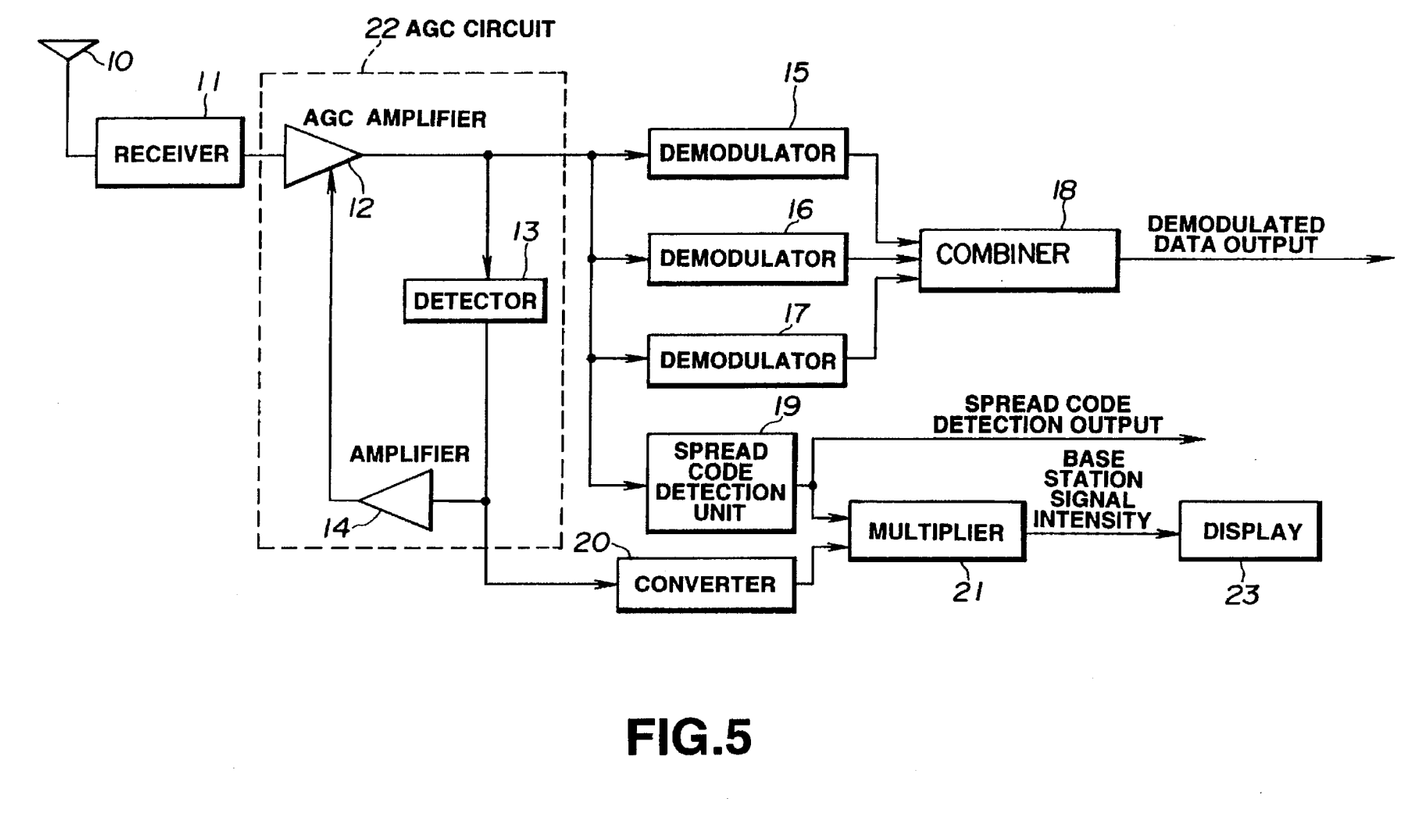
FIG. 5 is a schematic block circuit diagram showing a first embodiment of the present invention.

In FIG. 5, an input signal from a base station, received by an antenna 10, is converted in frequency by a receiver 11 so as to enter an automatic gain control circuit (AGC circuit) 22. The input signal, adjusted to a pre-set power by the AGC circuit 22, is fed to a base station spread code detection unit 19, termed a searcher, and a plurality of, herein three, demodulators 15, 16 and 17. The spread code detection unit 19 measures the intensity and the timing of the pilot channel signal which is the spread code signal transmitted from the base station. The demodulators 15 to 17 separately demodulate signals with different time delays generated by different paths, namely multipasses, or signals transmitted from different base stations for soft hand-off. The demodulators 15 to 17 are fed with an output signal from the spread code detection unit 19 and perform demodulation on the basis of an output of the spread code detection unit 19. Outputs of these demodulators 15 to 17 are routed to a combiner unit 18 which combines respective demodulated outputs to output a combined demodulated signal with a high S/N ratio.

An AGC circuit 22 is made up of an AGC amplifier 12, a detector 13 and an amplifier 14 for amplifying an output of the detector 13 for generating a control signal for the AGC amplifier 12. For providing a constant power of the amplifier 12, a control signal is fed back to the amplifier 12 via the detector 13 and the amplifier 14.

An output of the detector 13 in the AGC circuit 22 is equivalent to the total signal intensity of the currently received frequency channel and is converted by a converter 20 into the power information entering a multiplier 21. An output of the spread spectrum detection unit 19 representing the measured signal intensity also enters the multiplier 21. The multiplier 21 multiplies the output of the spread code detection unit 19, that is, the signal intensity or power of the pilot channel of the base station being received, by an output of the converter 20, or the total received power. An output of the multiplier 21 is fed to a display 23 of, for example, a liquid crystal display device, so as to be displayed and utilized as the actual power level of the pilot channel of the base station being currently received. In this manner, the measure of how stable the call may be can be easily ascertained by the user.

That is, if the output of the converter 20, that is, the total received power, is Et, an output power of the AGC circuit 22 is Ea, the signal power of the pilot channel of the base station i detected by the searcher, that is, the spread code detection unit 19, is Esi, and the actual signal power of the pilot channel of the base station is Epi, the output of the multiplier 21 is represented by an equation $$Epi = Et \times Esi / Ea \quad (1)$$

Since the input signal to the spread code detection unit 19 (searcher) has been adjusted to the constant power Ea by the AGC circuit 22, it is the ratio of the power of the pilot channel of each base station to the total received power of the spread code detection unit 19 (Esi/Ea) that can be output by the spread code detection unit 19. This output of the detection unit 19 is multiplied by the output of the converter 20, that is, the total received power Et, to give the power level of the pilot channel of the base station. While the output of the spread code detection unit 19 is Esi/Ea, since Ea is constant, the output may be considered to be Esi by omitting Ea and the output can still be used as the measure of the receiving state.

Figure 6:
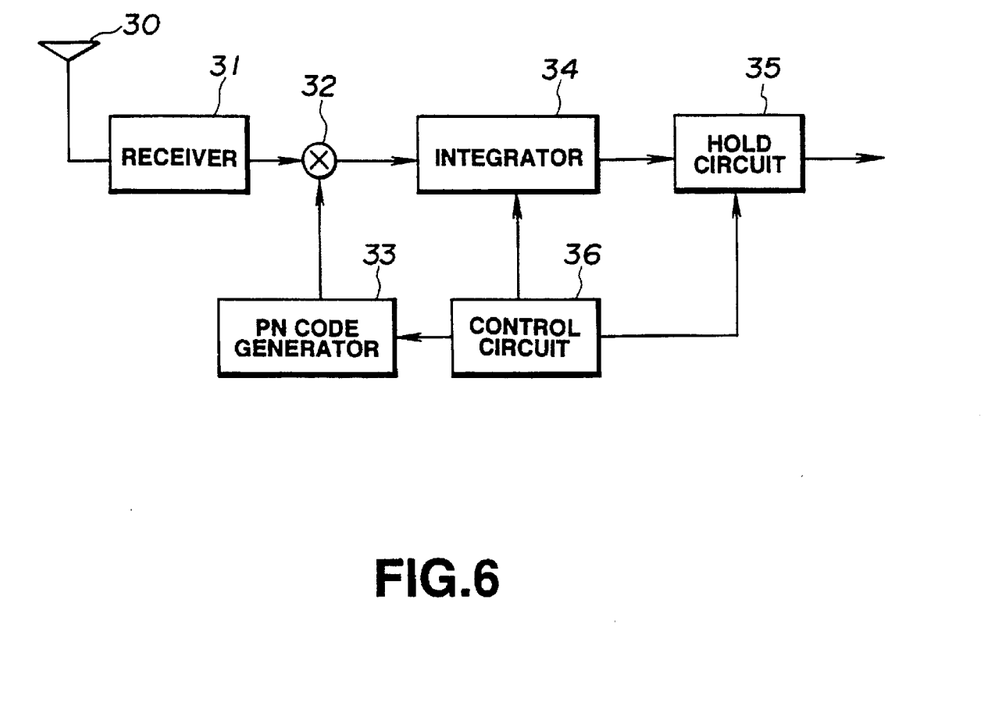
FIG. 6 is a block circuit diagram showing a circuit for measuring the signal intensity and the timing of a spread code contained in the pilot channel transmitted by the base station.

FIG. 6 shows a constructional example of a circuit used in digital processing for measuring the signal intensity and the timing of the spread code contained in the pilot channel transmitted by the base station.

In FIG. 6, the signal from the base station, produced via an antenna 30, is down-converted and detected by a receiver 31 so as to enter a multiplier 32. The pseudo-random number or the PN code generated by the PN code generator 33 also enters the multiplier 32 so as to be multiplied by the reception signal. The pseudo-random number generated by a PN code generator 33 also enters an integrator 34 where the results of multiplication at respective time instants are summed together.

After being reset by a reset signal from a control circuit 36, the integrator 34 sums its input signals. An output of the integrator 34 is held by a hold circuit 35 in which the result of correlation is produced. The result of correlation is the value of correlation between the received signal and the PN code at a time instant, that is, the result of correlation is an instantaneous value of correlation. Thus it is necessary to temporally shift the output of the PN code generator 33 and to repeat the operation of finding the value of correlation in order to produce the result over a period of the PN code. The input signal from the control circuit 36 to the PN code generator 33 is a control signal for shifting the PN code in the manner as described above.

By employing the above-described pilot channel detection circuit, the correlation value for the all of the time instants on shifting the PN code by one period is produced. Although this method is time-consuming in finding the relative correlation at all time points over a period of the PN code, the circuit scale may be diminished, and the code length for finding the correlation may be varied as desired. For application to the spread code detection unit 19 shown in FIG. 5, it suffices to route the output of the AGC circuit 22 to the multiplier 32.

Figure 7:
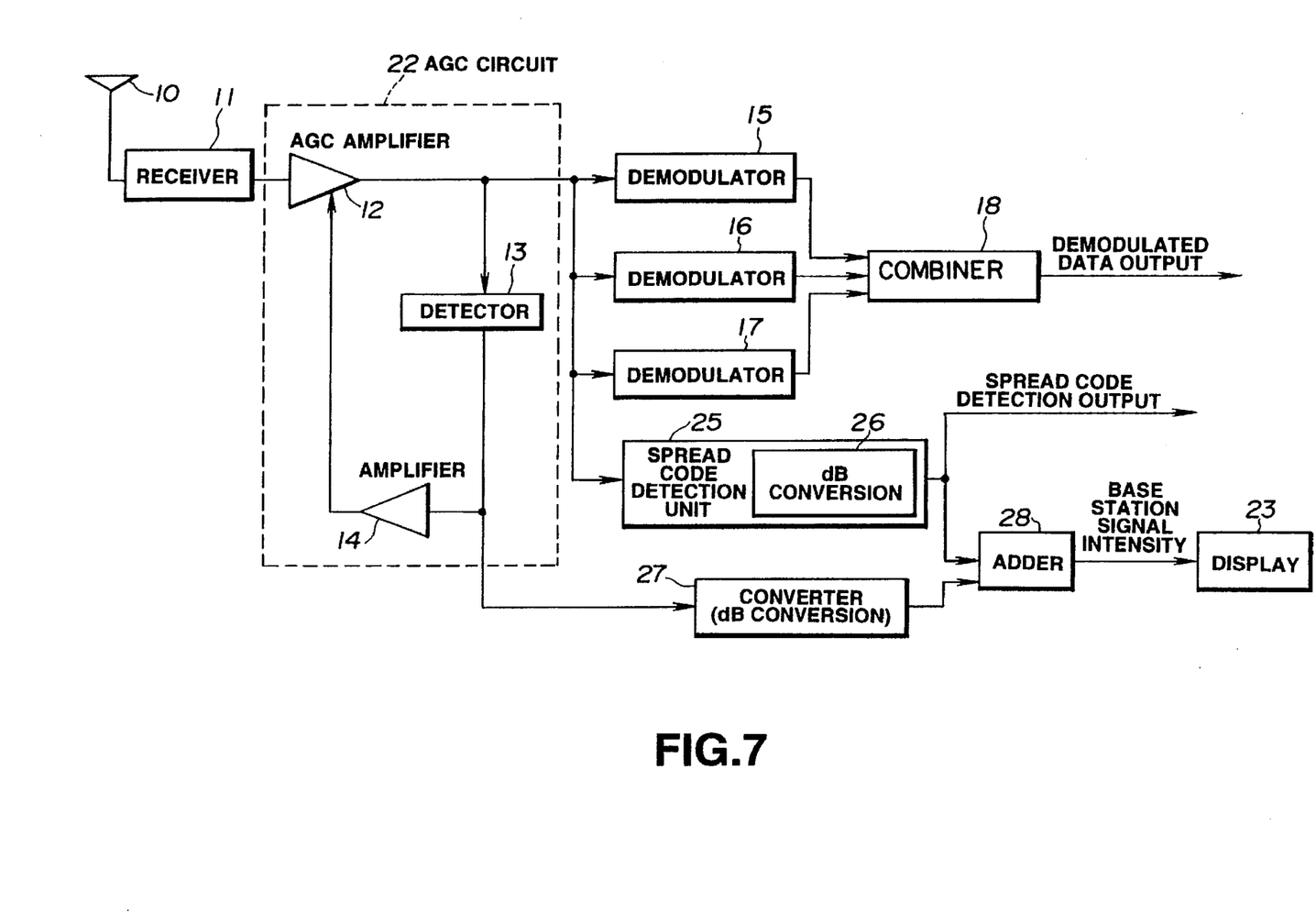
FIG. 7 is a schematic block diagram showing a second embodiment of the present invention.

FIG. 7 shows, in a schematic block circuit diagram, a second embodiment of the present invention. The circuit of FIG. 7 is basically of the same construction as the circuit of FIG. 5. The most significant difference is that an adder 28 is used in FIG. 7 in place of the multiplier 21 in FIG. 5. This difference is related with the difference as to whether outputs of the spread code detection unit as the searcher and the converter are of linear or logarithmic values. The adder is used if the outputs are of logarithmic values, that is, in dB representation.

That is, the spread code detection unit 25 shown in FIG. 7 has an internal dB conversion function unit 26, and gives a logarithmic output value. The converter 27 converts an output of the detector 18 of the AGC circuit 22 into a corresponding logarithmic output. The output of the converter 27 is the total received power represented in dB. If such total received power is denoted as $Et_{dB}$, an output power of the AGC circuit 222 in dB is denoted as $Ra_{dB}$, a signal power of a pilot channel of a base station i in dB, detected by the spread code detection unit 25 (searcher), is denoted as $Esi_{dB}$ and the actual signal power of the pilot channel of the base station is denoted as $Epi_{dB}$, an output of the adder is represented by an equation $$Rpi_{dB} = Et_{dB} + Esi_{dB} - Ea_{dB} \quad (2)$$

This equation is equivalent to the equation (1) since the parameters of the equation (1) are represented in dB and hence addition and subtraction operations have been substituted for multiplication and division operations, respectively. The output of the adder 28 is routed to the display 23 where the received power of the base station currently engaged in communication is displayed in dB.

The construction and the operation of the embodiment shown in FIG. 7 is similar to those shown in FIG. 5 and hence parts or components corresponding to those shown in FIG. 5 are denoted by the common reference numerals and the corresponding description is not made.

According to the present invention, as described above, the reception signal intensity of the pilot channel of each base station can be measured in the CDMA cellular system in which the signal intensity of each base station cannot be detected by the reception signal intensity measurement method employed in the analog cellular system. The reception signal intensity thus measured may be employed as a measure presented to the user as representative of call quality.

The present invention is not limited to the above-described embodiments. For example, although the description has been made in the above embodiments in connection with communication between a plurality of base stations and the mobile station, the present invention may be applied to communication between a plurality of communication units, such as mobile stations. The signal intensity detection apparatus, made up of the AGC circuit 22, spread code detection units 19 or 25, converters 20 or 27, the multiplier 21 or the adder 28, may be applied not only to the communication apparatus as a mobile terminal of the above-described CDMA cellular system, but to a variety of other types of communication apparatus, so as to be employed for accurately detecting the reception signal intensity of one of a plurality of communication stations multiplexed on the same frequency channel.

What is claimed is:

1. A spread spectrum communication apparatus for communication by a spread spectrum communication system with a plurality of communication units comprising:

reception means for receiving signals of a frequency channel including a target communication unit;

automatic gain control means for controlling a signal intensity of the frequency channel received by said reception means;

spread code detection means for detecting a signal intensity of the spread spectrum code of the target communication unit from an output signal of said automatic gain control means; and synthesis means for combining a gain control signal from said automatic gain control means with the signal intensity as detected by said spread code detection means to find a reception intensity.

2. The spread spectrum communication apparatus as claimed in claim 1, wherein said synthesis means comprises a multiplier for multiplying said gain control signal and the signal intensity of said spread code from said spread code detection means.

3. The spread spectrum communication apparatus as claimed in claim 1, further comprising conversion means for converting the gain control signal from said automatic gain control means into corresponding logarithmic values, said spread code detection means outputting the signal intensity in logarithmic representation.

4. The spread spectrum communication apparatus as claimed in claim 3 wherein said synthesis means comprises an adder for adding the signal intensity represented in logarithmic scale on the basis of said gain control signal from said conversion means to the signal intensity from said spread code detection means in logarithmic representation.

5. The spread spectrum communication apparatus as claimed in claim 1, further comprising display means for displaying the reception signal intensity output by said synthesis means.

6. An apparatus for detecting signal intensity comprising:

automatic gain control means for controlling the intensity of a received signal;

spread code detection means for detecting a signal intensity of a pre-set spread spectrum code from an output signal of said automatic gain control means; and synthesis means for combining a gain control signal of said automatic gain control means with the signal intensity as detected by said spread code detection means to produce a signal representing a reception intensity.

* * * * *